US012334757B2

(12) United States Patent
Hsu et al.

(10) Patent No.: US 12,334,757 B2
(45) Date of Patent: Jun. 17, 2025

(54) SWITCHING CHARGER FOR SUPPLYING STABLE POWER

(71) Applicant: ANPEC ELECTRONICS CORPORATION, Hsinchu (TW)

(72) Inventors: Chun-Kai Hsu, Hsinchu (TW); Chih-Heng Su, Hsinchu (TW); Chih-Ning Chen, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 588 days.

(21) Appl. No.: 17/868,054

(22) Filed: Jul. 19, 2022

(65) Prior Publication Data

US 2023/0369868 A1 Nov. 16, 2023

(30) Foreign Application Priority Data

May 10, 2022 (TW) .................................. 111117393

(51) Int. Cl.
*H02J 7/00* (2006.01)
*G05F 1/56* (2006.01)
*H03F 3/45* (2006.01)
*H03K 19/20* (2006.01)

(52) U.S. Cl.
CPC ............ *H02J 7/00047* (2020.01); *G05F 1/56* (2013.01); *H03F 3/45475* (2013.01); *H03K 19/20* (2013.01)

(58) Field of Classification Search
CPC ..... H02J 7/00047; H02J 2207/20; G05F 1/56; H03F 3/45475; H03F 3/45; H03K 19/20; H02M 1/36; H02M 1/088
See application file for complete search history.

(56) References Cited

U.S. PATENT DOCUMENTS

2020/0395905 A1* 12/2020 Schober .............. H03F 3/45183

FOREIGN PATENT DOCUMENTS

CN          113224948 B   *  9/2021
KR        20210020919 A   *  2/2021

* cited by examiner

*Primary Examiner* — Jack Chiang
*Assistant Examiner* — Brandon Bowers
(74) *Attorney, Agent, or Firm* — Li & Cai Intellectual Property (USA) Office

(57) ABSTRACT

A switching charger for supplying stable power is provided. First input terminals of first and fourth operational amplifiers and a second input terminal of a second operational amplifier are connected to a battery. A second input terminal of the first operational amplifier is coupled to a reference voltage. A first input terminal of the second operational amplifier and a second input terminal of the fourth operational amplifier are connected to an inductor. A first input terminal of a third operational amplifier is connected to an input power source. A second input terminal of the third operational amplifier is connected to a system circuit. A first selector circuit is connected to output terminals of the third and fourth operational amplifiers. A second selector circuit is connected to output terminals of the first and second operational amplifiers and the first selector circuit.

15 Claims, 5 Drawing Sheets

SWITCHING CHARGER FOR SUPPLYING STABLE POWER

CROSS-REFERENCE TO RELATED PATENT APPLICATION

This application claims the benefit of priority to Taiwan Patent Application No. 111117393, filed on May 10, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a switching charger, and more particularly to a switching charger for supplying stable power.

BACKGROUND OF THE DISCLOSURE

In recent years, with the continuous advancement of technology, various electronic products with different functions have gradually been developed to satisfy different requirements. Such electronic products have become an indispensable part of people's daily lives and make people's lives more convenient. The electronic product may include a plurality of electronic components to which different voltages need to be supplied. Therefore, a conventional switching charger is used to convert input voltages into different appropriate voltages and supply the appropriate voltages respectively to the electronic components such that the electronic product can operate normally. However, since switch components of the conventional switching charger cannot be switched quickly, the conventional switching charger often cannot supply sufficient voltage to the electronic product when high power is required.

SUMMARY OF THE DISCLOSURE

In response to the above-referenced technical inadequacies, the present disclosure provides a switching charger for supplying stable power. The switching charger includes a switch circuit, a plurality of operational amplifiers, a first selector circuit, a second selector circuit and a control circuit. The switch circuit is connected to an input power source and a first terminal of an inductor. A second terminal of the inductor is connected to a battery. The plurality of operational amplifiers includes a first operational amplifier, a second operational amplifier, a third operational amplifier, and a fourth operational amplifier. A first input terminal of the first operational amplifier is connected to the battery. A second input terminal of the first operational amplifier is coupled to a first reference voltage. A first input terminal of the second operational amplifier is connected to the second terminal of the inductor. A second input terminal of the second operational amplifier is connected to the battery. A first input terminal of the third operational amplifier is connected to the input power source. A second input terminal of the third operational amplifier is connected to a system circuit. A first input terminal of the fourth operational amplifier is connected to the battery. A second input terminal of the fourth operational amplifier is connected to the second terminal of the inductor. The first selector circuit is connected to an output terminal of the third operational amplifier and an output terminal of the fourth operational amplifier. The first selector circuit is configured to select one of a signal outputted by the third operational amplifier and a signal outputted by the fourth operational amplifier to output a first selected signal. The second selector circuit is connected to an output terminal of the first operational amplifier, an output terminal of the second operational amplifier and an output terminal of the first selector circuit. The second selector circuit is configured to select one of the first selected signal, a signal outputted by the first operational amplifier and a signal outputted by the second operational amplifier to output a second selected signal. The control circuit is connected to the second selector circuit and the switch circuit. The control circuit is configured to control the switch circuit according to the second selected signal.

In certain embodiments, the switching charger further includes a voltage divider circuit. An input terminal of the voltage divider circuit is connected to the battery. An output terminal of the voltage divider circuit is connected to the first input terminal of the first operational amplifier.

In certain embodiments, the voltage divider circuit includes a first voltage dividing resistor and a second voltage dividing resistor. A first terminal of the first voltage dividing resistor is connected to the battery. A first terminal of the second voltage dividing resistor is connected to a second terminal of the first voltage dividing resistor and the first input terminal of the first operational amplifier. A second terminal of the second voltage dividing resistor is grounded.

In certain embodiments, the switch circuit includes a high-side switch and a low-side switch. A first terminal of the high-side switch is connected to the input power source. A control terminal of the high-side switch is connected to the control circuit. A first terminal of the low-side switch is connected to a second terminal of the high-side switch. A second terminal of the low-side switch is grounded. A node between the first terminal of the low-side switch and the second terminal of the high-side switch is connected to the first terminal of the inductor. A control terminal of the low-side switch is connected to the control circuit.

In certain embodiments, the switching charger further includes a NOT gate. An input terminal of the NOT gate is connected to the control circuit. An output terminal of the NOT gate is connected to the control terminal of the low-side switch.

In certain embodiments, the plurality of operational amplifiers further include a fifth operational amplifier. A first input terminal of the fifth operational amplifier is connected to the output terminal of the second operational amplifier. A second input terminal of the fifth operational amplifier is coupled to a second reference voltage. An output terminal of the fifth operational amplifier is connected to the second selector circuit. The second selector circuit is configured to select one of the first selected signal, the signal outputted by the first operational amplifier and a signal outputted by the fifth operational amplifier to output the second selected signal.

In certain embodiments, the plurality of operational amplifiers further include a sixth operational amplifier. A first input terminal of the sixth operational amplifier is connected to the output terminal of the third operational amplifier. A second input terminal of the sixth operational amplifier is coupled to a third reference voltage. An output terminal of the sixth operational amplifier is connected to the first selector circuit. The first selector circuit is configured to select one of a signal outputted by the sixth operational amplifier and the signal outputted by the fourth operational amplifier to output the first selected signal.

In certain embodiments, the plurality of operational amplifiers further include a seventh operational amplifier. A first input terminal of the seventh operational amplifier is coupled to a fourth reference voltage. A second input terminal of the seventh operational amplifier is connected to the output terminal of the fourth operational amplifier. An output terminal of the seventh operational amplifier is connected to the first selector circuit. The first selector circuit is configured to select one of a signal outputted by the sixth operational amplifier and a signal outputted by the seventh operational amplifier to output the first selected signal.

In certain embodiments, the switching charger further includes a sensing resistor. A first terminal of the sensing resistor is connected to the first input terminal of the second operational amplifier, the second input terminal of the fourth operational amplifier and the second terminal of the inductor. A second terminal of the sensing resistor is connected to the second input terminal of the second operational amplifier, the first input terminal of the fourth operational amplifier and the battery.

In certain embodiments, the switching charger further includes an input resistor. A first terminal of the input resistor is connected to the input power source and the first input terminal of the third operational amplifier. A second terminal of the input resistor is connected to the second input terminal of the third operational amplifier, the switch circuit and the system circuit.

In certain embodiments, the switching charger further includes a first switch component, a second switch component and a first switching circuit. A first terminal of the first switch component is connected to the input power source. A first terminal of the second switch component is connected to a second terminal of the first switch component. A second terminal of the second switch component is connected to the first terminal of the input resistor. The first switching circuit is connected to a control terminal of the first switch component and a control terminal of the second switch component. The first switching circuit is configured to switch the first switch component and the second switch component.

In certain embodiments, the switching charger further includes an error amplifier. A first input terminal of the error amplifier is connected to an output terminal of the second selector circuit. A second input terminal of the error amplifier is coupled to the first reference voltage. An output terminal of the error amplifier is connected to an input terminal of the control circuit.

In certain embodiments, the switching charger further includes an operational amplifier. A first input terminal of the operational amplifier is connected to the output terminal of the error amplifier. A second input terminal of the operational amplifier is connected to an output terminal of an oscillator circuit. An output terminal of the operational amplifier is connected to the input terminal of the control circuit.

In certain embodiments, the switching charger further includes a first resistor, a first capacitor and a second capacitor. A first terminal of the first resistor is connected to the output terminal of the second selector circuit and a second capacitor. A first terminal of the first capacitor is connected to a second terminal of the first capacitor. A second terminal of the first capacitor is connected to the first input terminal of the error amplifier. A first terminal of the second capacitor is connected to the first input terminal of the error amplifier. A second terminal of the second capacitor is connected to the output terminal of the error amplifier.

In certain embodiments, the switching charger further includes a second resistor, a third resistor and a third capacitor. A first terminal of the second resistor is connected to the output terminal of the second selector circuit. A first terminal of the third resistor is connected to the first input terminal of the error amplifier. A first terminal of the third capacitor is connected to a second terminal of the third resistor. A second terminal of the third capacitor is connected to the output terminal of the error amplifier.

As described above, the present disclosure provides the switching charger for supplying the stable power. The configurations of the switching charger of the present disclosure are different from that of a conventional switching charger. The switching charger of the present disclosure performs operations different from that of the conventional switching charger. As a result, voltage signals and current signals outputted by the switching charger of the present disclosure are more stable than those of the conventional switching charger.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
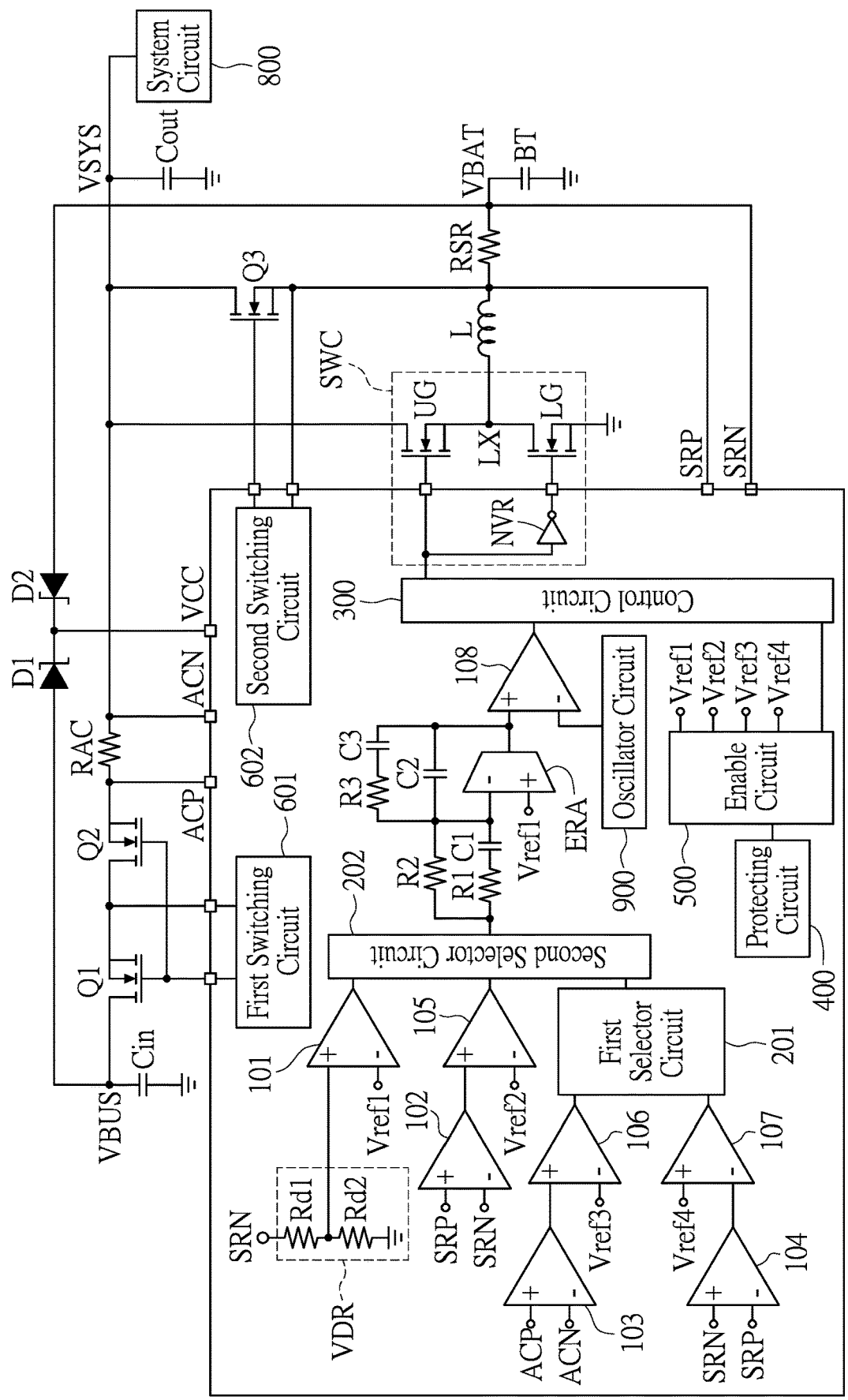
FIG. 1 is a circuit diagram of a switching charger for supplying stable power according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit diagram of a switching charger for supplying stable power according to an embodiment of the present disclosure.

In the embodiment, the switching charger of the embodiment of the present disclosure may include a switch circuit SWC, a first operational amplifier 101, a second operational amplifier 102, a third operational amplifier 103, a fourth operational amplifier 104, a first selector circuit 201, a second selector circuit 202 and a control circuit 300 as shown in FIG. 1.

If necessary, the switching charger of the embodiment of the present disclosure may further include one or more of: a fifth operational amplifier 105, a sixth operational amplifier 106, a seventh operational amplifier 107, a voltage divider circuit VDR, a sensing resistor RSR, an input resistor RAC, a first switch component Q1, a second switch component Q2, a third switch component Q3, a first switching circuit 601, a second switching circuit 602, an error amplifier ERA, an operational amplifier 108, a first resistor R1, a first capacitor C1, a second capacitor C2, a second resistor R2, a third resistor R3, a third capacitor C3, a first Zener diode D1, a second Zener diode D2, a protecting circuit 400 and an enable circuit 500.

Configurations of the circuit components included in the switching charger of the embodiment of the present disclosure as shown in FIG. 1 are described in the embodiment, but the present disclosure is not limited thereto. In practice, the switching charger of the present disclosure may only include some of the circuit components as shown in FIG. 1, and others of the circuit components may be appropriately omitted.

First, the first Zener diode D1 and the second Zener diode D2 may be disposed between an input power source for supplying an input voltage VBUS and a system circuit 800. The input power source may be connected to a first terminal of a capacitor Cin. An input current supplied by the input power source may flow to the capacitor Cin to charge a voltage of the capacitor Cin to be equal to the input voltage VBUS. The input current supplied by the input power source may also flow to the system circuit 800 (and a battery BAT).

The first switch component Q1, the second switch component Q2 and the input resistor RAC may be disposed between the input power source for supplying the input voltage VBUS and the system circuit 800. A first terminal of the first switch circuit Q1 may be connected to the input power source or the first terminal of the capacitor Cin. A second terminal of the capacitor Cin may be grounded.

A second terminal of the first switch circuit Q1 may be connected to a first terminal of the second switch component Q2. A second terminal of the second switch component Q2 may be connected to a first terminal of the input resistor RAC. A second terminal of the input resistor RAC may be connected to the system circuit 800 and a first terminal of an output capacitor Cout. A second terminal of the output capacitor Cout may be grounded.

The first switching circuit 601 may be connected to a control terminal of the first switch circuit Q1 and a control terminal of the second switch circuit Q2. The first switching circuit 601 may turn on or off the first switch circuit Q1 and the second switch circuit Q2 to allow or disable the input current supplied by the input power source to flow to the system circuit 800 (and the battery BAT).

The switch circuit SWC may include a high-side switch UG and a low-side switch LG. A control terminal of the high-side switch UG may be connected to an output terminal of the control circuit 300. A NOT gate NVR may be disposed between a control terminal of the low-side switch LG and the control circuit 300. A first terminal of the NOT gate NVR may be connected to the output terminal of the control circuit 300. An output terminal of the NOT gate NVR may be connected to the control terminal of the low-side switch LG.

A first terminal of the high-side switch UG may be connected to the second terminal of the input resistor RAC. A first terminal of the low-side switch LG may be connected to a second terminal of the high-side switch UG. A second terminal of the high-side switch UG may be grounded. A node LX between the first terminal of the low-side switch LG and the second terminal of the high-side switch UG may be connected to a first terminal of an inductor L. A second terminal of the inductor L may be connected to a first terminal SRP of the sensing resistor RSR. A second terminal SRN of the sensing resistor RSR may be connected to the battery BAT.

A first terminal of the third switch component Q3 may be connected to the second terminal of the input resistor RAC. A second terminal of the third switch component Q3 may be connected to the second terminal of the inductor L and the first terminal SRP of the sensing resistor RSR. The second switching circuit 602 may be connected to a control terminal and a second terminal of the third switch component Q3. The second switching circuit 602 may turn on or off the third switch component Q3.

It is worth noting that, a first input terminal such as a non-inverting input terminal of the first operational amplifier 101 may be connected to the second terminal SRN of the sensing resistor RSR and the battery BT, and may obtain a voltage of the second terminal SRN of the sensing resistor RSR (that is a battery voltage VBAT). A second input terminal such as an inverting input terminal of the first operational amplifier 101 may be coupled to a first reference voltage Vref1. An output terminal of the first operational amplifier 101 may be connected to an input terminal of the second selector circuit 202.

The first operational amplifier 101 may multiply a difference between the voltage of the second terminal SRN of the sensing resistor RSR (that is the battery voltage VBAT) and the first reference voltage Vref1 by a first gain to output a first amplified signal to the second selector circuit 202.

If necessary, the voltage divider circuit VDR may be disposed in the switching charger. The voltage divider circuit VDR may be connected between the first input terminal such as the non-inverting input terminal of the first operational amplifier 101 and the second terminal SRN of the sensing resistor RSR. In addition, the voltage divider circuit VDR may be connected between the first input terminal of the first operational amplifier 101 and the battery BT.

An input terminal of the voltage divider circuit VDR may be connected to the battery BT. An output terminal of the voltage divider circuit VDR may be connected to the first input terminal of the first operational amplifier 101.

In detail, the voltage divider circuit VDR may include a first voltage dividing resistor Rd1 and a second voltage dividing resistor Rd2. A first terminal of the first voltage dividing resistor Rd1 may be connected to the second terminal SRN of the sensing resistor RSR and the battery BT. A first terminal of the second voltage dividing resistor Rd2 may be connected to a second terminal of the first voltage dividing resistor Rd1 and the first input terminal such as the non-inverting input terminal of the first operational amplifier 101. A second terminal of the second voltage dividing resistor Rd2 is grounded.

If the voltage divider circuit VDR is disposed in the switching charger, the difference between the voltage of the second terminal SRN of the sensing resistor RSR (that is the battery voltage VBAT) and the first reference voltage Vref1 is divided by the voltage divider circuit VDR. The first operational amplifier 101 may multiply the divided difference by the first gain to output the first amplified signal to the second selector circuit 202.

A first input terminal such as the non-inverting input terminal of the second operational amplifier 102 may be connected to the first terminal SRP of the sensing resistor RSR and the second terminal of the inductor L. A second input terminal such as an inverting input terminal of the second operational amplifier 102 may be connected to the second terminal SRN of the sensing resistor RSR and the battery BT.

The second operational amplifier 102 may multiply a difference between the voltage of the first terminal SRP of the sensing resistor RSR and the voltage of the second terminal SRN of the sensing resistor RSR by a second gain to output a second amplified signal.

A first input terminal such as a non-inverting input terminal of the fifth operational amplifier 105 may be connected to an output terminal of the second operational amplifier 102, and may receive the second amplified signal from the output terminal of the second operational amplifier 102. A second input terminal such as an inverting input terminal of the fifth operational amplifier 105 may be coupled to a second reference voltage Vref2. An output terminal of the fifth operational amplifier 105 may be connected to the input terminal of the second selector circuit 202.

The fifth operational amplifier 105 may multiply a difference between a voltage of the second amplified signal and the second reference voltage Vref2 by a fifth gain to output a fifth amplified signal.

A first input terminal such as a non-inverting input terminal of the third operational amplifier 103 may be connected to a first terminal ACP of the input resistor RAC. A second input terminal such as an inverting input terminal of the third operational amplifier 103 may be connected to a second terminal ACN of the input resistor RAC. The third operational amplifier 103 may multiply a difference between a voltage of the first terminal ACP of the input resistor RAC and a voltage of the second terminal ACN of the input resistor RAC by a third gain to output a third amplified signal.

A first input terminal such as a non-inverting input terminal of the sixth operational amplifier 106 may be connected to an output terminal of the third operational amplifier 103, and may receive the third amplified signal from the output terminal of the third operational amplifier 103. A second input terminal such as an inverting input terminal of the sixth operational amplifier 106 may be coupled to a third reference voltage Vref3. An output terminal of the sixth operational amplifier 106 may be connected to an input terminal of the first selector circuit 201.

The sixth operational amplifier 106 may multiply a difference between a voltage of the third amplified signal and the third reference voltage Vref3 by a sixth gain to output a sixth amplified signal to the first selector circuit 201.

The switching charger of the embodiment of the present disclosure is applicable to the system circuit 800. When high power is required for the system circuit 800, the switching charger of the embodiment of the present disclosure performs the following operations on the system circuit 800.

When high power is required for the system circuit 800 and a current flowing through the input resistor RAC is larger than a current threshold, the switching charger of the embodiment of the present disclosure outputs a boost mode triggering signal and clamps the input current supplied by the input power source. In a turbo boost mode, the input power source supplies the input current and the battery BAT supplies a discharge current at the same time. The input current flows from the input power source sequentially through the first switch component Q1, the second switch component Q2 and the input resistor RAC to the system circuit 800. The discharge current flows from the battery BT sequentially through the sensing resistor RSR, the inductor L and the high-side switch UG to the system circuit 800.

The discharge current supplied by the battery BAT increases with an increase in the power required for the system circuit 800. However, when the discharge current flowing from the battery BAT through the sensing resistor RSR is larger than the current threshold, the switching charger of the embodiment of the present disclosure clamps the discharge current of the battery BT to protect the battery BT. At this time, the input current of the input power source is unclamped and supplied to the system circuit 800.

It is worth noting that, the switching charger of the embodiment of the present disclosure includes the fourth operational amplifier 104 and the seventh operational amplifier 107 that are configured to realize the above-mentioned operations. In addition, the first selector circuit 201 is connected to the output terminal of the sixth operational amplifier 106 and an output terminal of the seventh operational amplifier 107. No matter whether or not the first selector circuit 201 enters the turbo boost mode, the first selector circuit 201 may continue to be turned on and not to be switched. The first selector circuit 201 being turned on continually determines and selects a signal outputted by the sixth operational amplifier 106 and a signal outputted by the seventh operational amplifier 107.

Configurations of the fourth operational amplifier 104, the seventh operational amplifier 107 and other circuit components are described in detail in the following.

A first input terminal such as a non-inverting input terminal of the fourth operational amplifier 104 may be connected to the second terminal SRN of the sensing resistor RSR and the battery BT. A second input terminal such as an inverting input terminal of the fourth operational amplifier 104 may be connected to the first terminal SRP of the sensing resistor RSR and the second terminal of the inductor L.

The fourth operational amplifier 104 may multiply a difference between the voltage of the first terminal SRP of the sensing resistor RSR (that is a voltage of the second terminal of the inductor L) and the voltage of the second terminal SRN of the sensing resistor RSR (that is the battery voltage VBAT) by a fourth gain to output a fourth amplified signal.

A first input terminal such as a non-inverting input terminal of the seventh operational amplifier 107 may be coupled to a fourth reference voltage Vref4. A second input terminal such as an inverting input terminal of the seventh operational amplifier 107 may be connected to an output terminal of the fourth operational amplifier 104. The second input terminal of the seventh operational amplifier 107 may receive the fourth amplified signal from the output terminal of the fourth operational amplifier 104. The output terminal of the seventh operational amplifier 107 may be connected to the input terminal of the first selector circuit 201.

The seventh operational amplifier 107 may multiply a difference between the fourth amplified signal from the fourth operational amplifier 104 and the fourth reference voltage Vref4 by a seventh gain to output a seventh amplified signal to the input terminal of the first selector circuit 201.

The first selector circuit 201 may select one of the sixth amplified signal from the sixth operational amplifier 106 and the seventh amplified signal from the seventh operational amplifier 107 to output a first selected signal to the second selector circuit 202.

Further, the input terminal of the second selector circuit 202 may be connected to the output terminal of the first operational amplifier 101, the output terminal of the fifth operational amplifier 105 and an output terminal of the first selector circuit 201.

The second selector circuit 202 may select one of the first amplified signal from the first operational amplifier 101, the fifth amplified signal from the fifth operational amplifier 105 and the first selected signal from the first selector circuit 201 to output a second selected signal.

It is worth noting that, when the discharge current flowing from the battery BAT through the sensing resistor RSR is larger than the current threshold, the first selector circuit 201 selects one of the fourth amplified signal from the fourth operational amplifier 104 and the seventh amplified signal from the seventh operational amplifier 107. Then, the second selector circuit 202 selects the first selected signal from first selector circuit 201. As a result, the discharge current of the battery BAT is clamped to a preset current value.

The control circuit 300 may be connected to an output terminal of the second selector circuit 202 (through other circuit components). The control circuit 300 may control the high-side switch UG and the low-side switch LG to operate according to the second selected signal (that is processed by the other circuit components).

If necessary, the other circuit components may be disposed between the output terminal of the second selector circuit 202 and an input terminal of the control circuit 300, which is described specifically in the following.

A first input terminal such as an inverting input terminal of the error amplifier ERA may be connected to the output terminal of the second selector circuit 202 (through the first resistor R1 and the first capacitor C1). A second input terminal such as a non-inverting input terminal of the error amplifier ERA may be coupled to the first reference voltage Vref1.

A first terminal of the first resistor R1 may be connected to the output terminal of the second selector circuit 202. A second terminal of the first resistor R1 may be connected to a first terminal of the first capacitor C1. A second terminal of the first capacitor C1 may be connected to the first input terminal of the error amplifier ERA. A first terminal of the second capacitor C2 may be connected to the first input terminal of the error amplifier ERA. A second terminal of the second capacitor C2 may be connected to an output terminal of the error amplifier ERA.

A first terminal of the second resistor R2 may be connected to the output terminal of the second selector circuit 202. A second terminal of the second resistor R2 may be connected to a first terminal of the third resistor R3 and the first input terminal such as the non-inverting input terminal of the error amplifier ERA. A second terminal of the third resistor R3 may be connected to a first terminal of the third capacitor C3. A second terminal of the third capacitor C3 may be connected to the output terminal of the error amplifier ERA.

A first input terminal such as a non-inverting input terminal of the operational amplifier 108 may be connected to the output terminal of the error amplifier ERA. A first input terminal such as an inverting input terminal of the operational amplifier 108 may be connected to an output terminal of an oscillator circuit 900. An output terminal of the operational amplifier 108 may be connected to the input terminal of the control circuit 300.

The operational amplifier 108 may multiply a difference between a voltage of an error amplified signal generated by the error amplifier ERA and an oscillating signal generated by the oscillator circuit 900 by an eighth gain to output an eighth amplified signal to the control circuit 300.

The control circuit 300 may control the high-side switch UG and the low-side switch LG to operate according to the eighth amplified signal from the operational amplifier 108.

If necessary, the protecting circuit 400 may determine a plurality of reference voltages such as the first reference voltage Vref1, the second reference voltage Vref2, the third reference voltage Vref3 and the fourth reference voltage Vref4, according to constraint parameters (such as an overcurrent threshold or an overvoltage threshold). The protecting circuit 400 may control the enable circuit 500 to output the reference voltages and to enable the control circuit 300 to operate.

Figure 2:
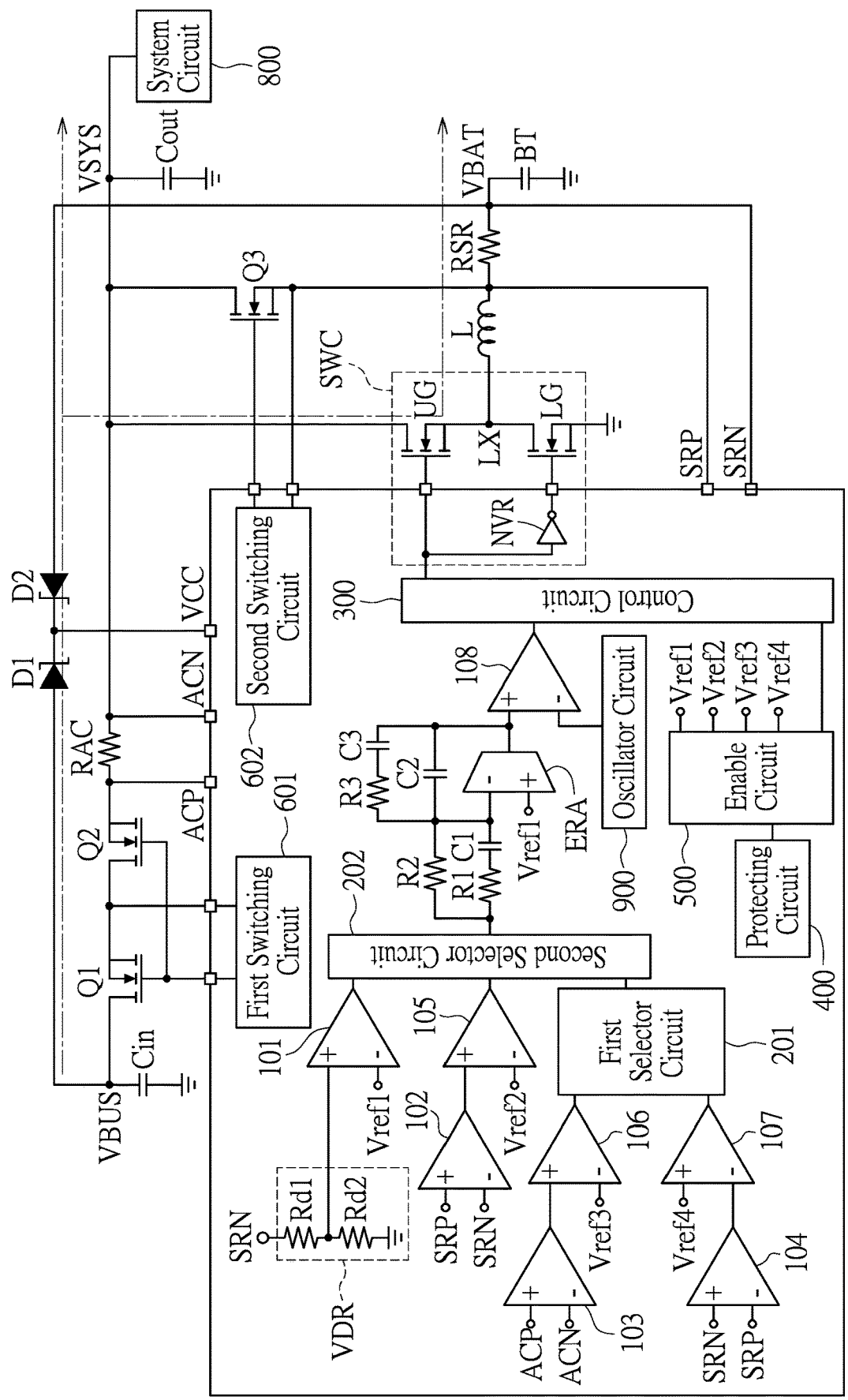
FIG. 2 is a schematic diagram of flowing paths of currents of the switching charger that does not enter a turbo boost mode according to the embodiment of the present disclosure.

Reference is made to FIGS. 1 and 2, in which FIG. 2 is a schematic diagram of flowing paths of currents of the switching charger that does not enter a turbo boost mode according to the embodiment of the present disclosure.

When the input power source can supply low power required for the system circuit 800, the switching charger of the present disclosure does not need to enter to the turbo boost mode and only the input power source supplies the input current to the system circuit 800. The input current flows from the input power source sequentially through the first switch component Q1, the second switch component Q2 and the input resistor RAC to the system circuit 800. At this time, the battery BAT does not need to supply power to the system circuit 800.

When only low power is required for the system circuit 800 and the input power source but not the battery BAT has enough power, the switching charger of the present disclosure does not enter the turbo boost mode. Under this condition, the input power source supplies power to both of the system circuit 800 and the battery BAT. At this time, the battery BAT does not need to supply power to the system circuit 800.

As shown in FIG. 2, the input current supplied by the input power source may be divided into a first input current and a second input current. The first input current flows sequentially through the first switch component Q1, the second switch component Q2 and the input resistor RAC to the system circuit 800. The second input current sequentially flows through the high-side switch UG, the inductor L and the sensing resistor RSR to the battery BT.

Figure 3:
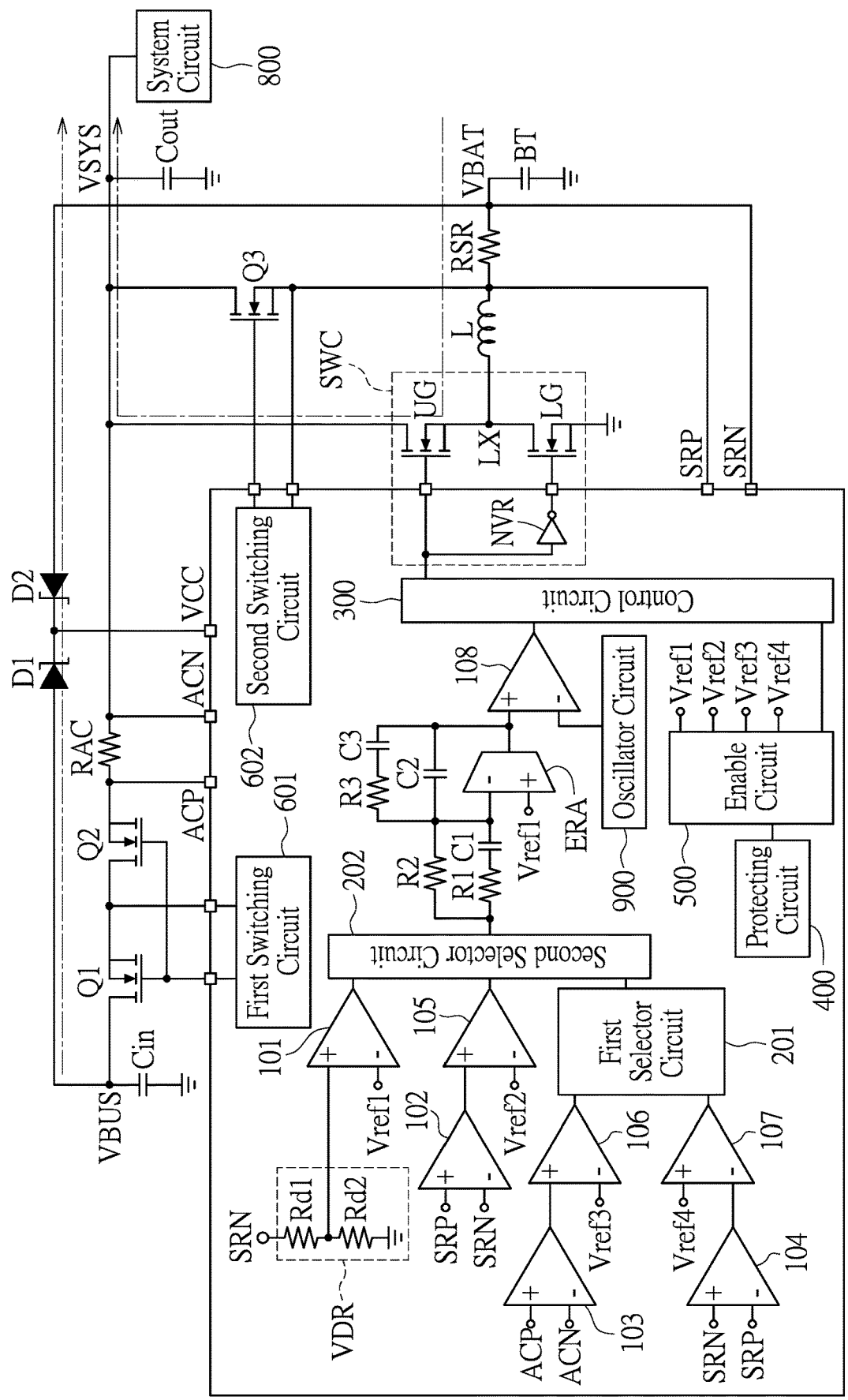
FIG. 3 is a schematic diagram of flowing paths of currents of the switching charger entering the turbo boost mode according to the embodiment of the present disclosure.

Reference is made to FIGS. 1 and 3, in which FIG. 3 is a schematic diagram of flowing paths of currents of the switching charger entering the turbo boost mode according to the embodiment of the present disclosure.

When high power is required for the system circuit 800 and the input power source supplies insufficient power to the system circuit 800, the switching charger of the present disclosure enters the turbo boost mode. In the turbo boost mode, the input current flows from the input power source sequentially through the first switch component Q1, the second switch component Q2 and the input resistor RAC to the system circuit 800. At the same time, the discharge current flows from the battery BAT sequentially through the sensing resistor RSR, the inductor L and the high-side switch UG to the system circuit 800. As a result, the system circuit 800 obtains sufficient power for operation.

Figure 4:
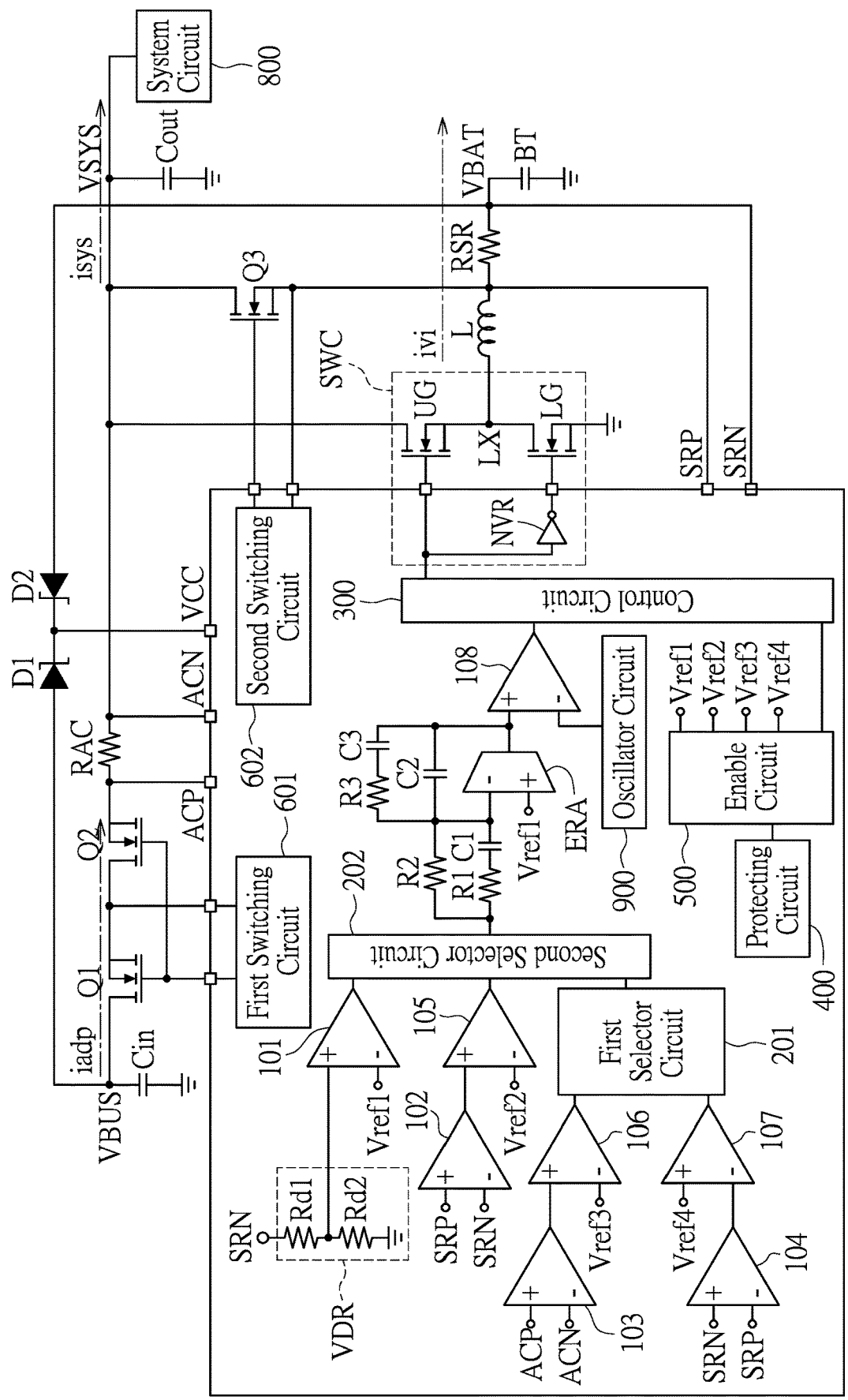
FIG. 4 is a schematic diagram of flowing of currents of the switching charger according to the embodiment of the present disclosure.
Figure 5:
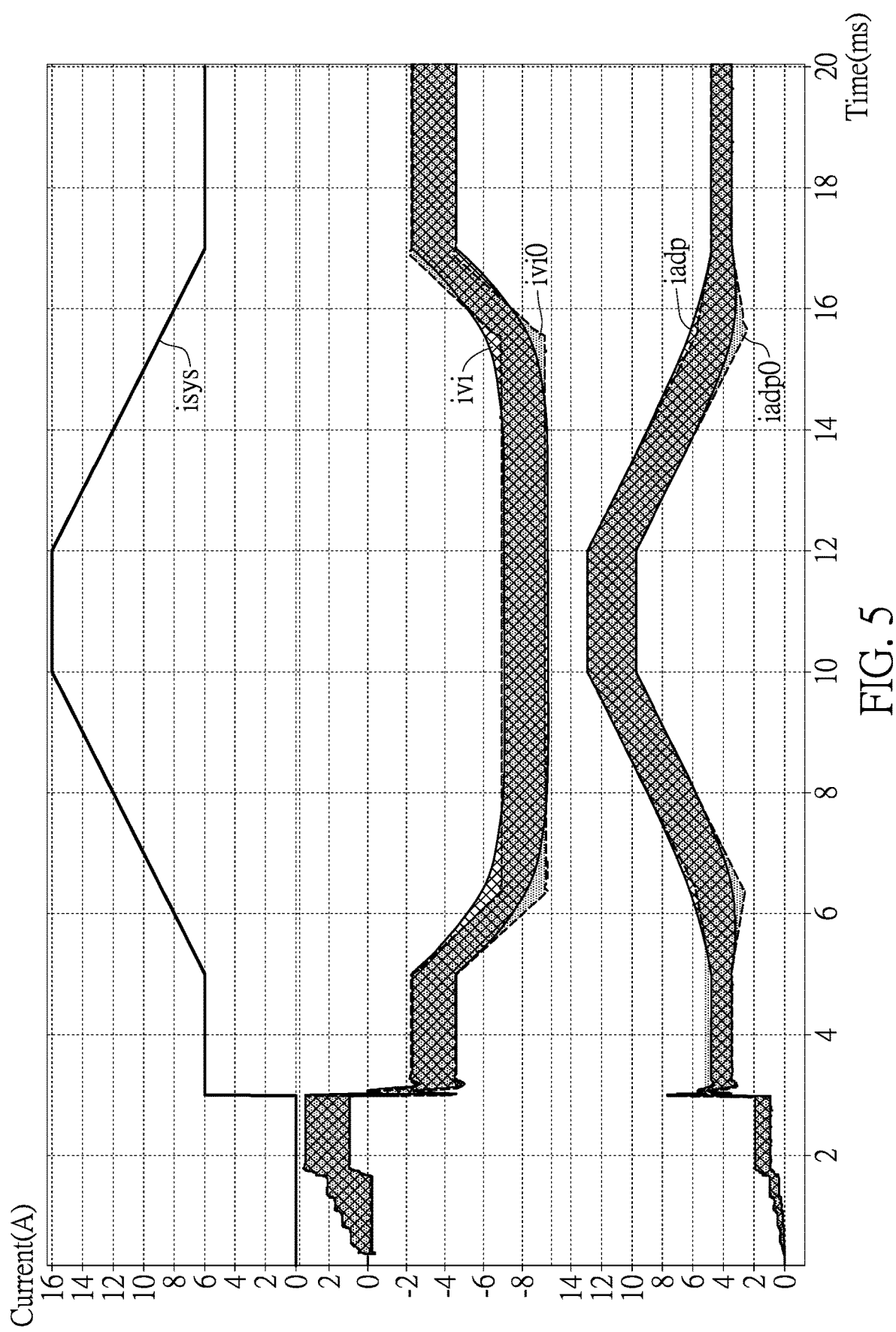
FIG. 5 is a waveform diagram of signals of the switching charger according to the embodiment of the present disclosure.

Reference is made to FIGS. 1, 4 and 5, in which FIG. 4 is a schematic diagram of flowing of currents of the switching charger according to the embodiment of the present disclosure, and FIG. 5 is a waveform diagram of signals of the switching charger according to the embodiment of the present disclosure.

As shown in FIG. 4, an input current iadp supplied by the input power source (connected to a first terminal of an input capacitor Cin) in the switching charger of the embodiment of the present disclosure may be divided into a first input current isys and a second input current ivi. The first input current isys flows to the system circuit 800. The second input current ivi flows to the battery BAT.

As shown in FIG. 5, a waveform of a signal of the input current iadp supplied by the switching charger of the present disclosure is smoother than a waveform of a signal of an input current iadp0 supplied by a conventional switching charger. A waveform of a signal of the second input current ivi supplied by the switching charger of the present disclosure is smoother than a waveform of a signal of a second input current ivi0 supplied by a conventional switching charger. The second input current ivi of the switching charger of the present disclosure is not affected by switching between different modes. Therefore, the power supplied by the switching charger of the present disclosure is more stable than that of the conventional switching charger.

In conclusion, the present disclosure provides the switching charger for supplying the stable power. The configurations of the switching charger of the present disclosure are different from that of the conventional switching charger. The switching charger of the present disclosure performs the above-mentioned operations different from that of the conventional switching charger. As a result, the voltage signals and the current signals outputted by of the switching charger of the present disclosure are more stable than that of the conventional switching charger.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A switching charger for supplying stable power, comprising:
    a switch circuit connected to an input power source and a first terminal of an inductor, a second terminal of the inductor being connected to a battery;
    a plurality of operational amplifiers including:
        a first operational amplifier, wherein a first input terminal of the first operational amplifier is connected to the battery, and a second input terminal of the first operational amplifier is coupled to a first reference voltage;
        a second operational amplifier, wherein a first input terminal of the second operational amplifier is connected to the second terminal of the inductor, and a second input terminal of the second operational amplifier is connected to the battery;
        a third operational amplifier, wherein a first input terminal of the third operational amplifier is connected to the input power source, and a second input terminal of the third operational amplifier is connected to a system circuit; and
        a fourth operational amplifier, wherein a first input terminal of the fourth operational amplifier is connected to the battery, and a second input terminal of the fourth operational amplifier is connected to the second terminal of the inductor;
    a first selector circuit connected to an output terminal of the third operational amplifier and an output terminal of the fourth operational amplifier, wherein the first selector circuit is configured to select one of a signal outputted by the third operational amplifier and a signal outputted by the fourth operational amplifier so as to output a first selected signal;
    a second selector circuit connected to an output terminal of the first operational amplifier, an output terminal of the second operational amplifier and an output terminal of the first selector circuit, wherein the second selector circuit is configured to select one of the first selected signal, a signal outputted by the first operational amplifier and a signal outputted by the second operational amplifier so as to output a second selected signal; and
    a control circuit connected to the second selector circuit and the switch circuit, and configured to control the switch circuit according to the second selected signal.

2. The switching charger according to claim 1, further comprising:
    a voltage divider circuit, wherein an input terminal of the voltage divider circuit is connected to the battery, and an output terminal of the voltage divider circuit is connected to the first input terminal of the first operational amplifier.

3. The switching charger according to claim 2, wherein the voltage divider circuit includes:
    a first voltage dividing resistor, wherein a first terminal of the first voltage dividing resistor is connected to the battery; and
    a second voltage dividing resistor, wherein a first terminal of the second voltage dividing resistor is connected to a second terminal of the first voltage dividing resistor and the first input terminal of the first operational amplifier, and a second terminal of the second voltage dividing resistor is grounded.

4. The switching charger according to claim 1, wherein the switch circuit includes:
a high-side switch, wherein a first terminal of the high-side switch is connected to the input power source, and a control terminal of the high-side switch is connected to the control circuit; and
a low-side switch, wherein a first terminal of the low-side switch is connected to a second terminal of the high-side switch, a second terminal of the low-side switch is grounded, a node between the first terminal of the low-side switch and the second terminal of the high-side switch is connected to the first terminal of the inductor, and a control terminal of the low-side switch is connected to the control circuit.

5. The switching charger according to claim 4, further comprising:
a NOT gate, wherein an input terminal of the NOT gate is connected to the control circuit, and an output terminal of the NOT gate is connected to the control terminal of the low-side switch.

6. The switching charger according to claim 1, wherein the plurality of operational amplifiers further include:
a fifth operational amplifier, wherein a first input terminal of the fifth operational amplifier is connected to the output terminal of the second operational amplifier, a second input terminal of the fifth operational amplifier is coupled to a second reference voltage, and an output terminal of the fifth operational amplifier is connected to the second selector circuit;
wherein the second selector circuit is configured to select one of the first selected signal, the signal outputted by the first operational amplifier and a signal outputted by the fifth operational amplifier so as to output the second selected signal.

7. The switching charger according to claim 6, wherein the plurality of operational amplifiers further include:
a sixth operational amplifier, wherein a first input terminal of the sixth operational amplifier is connected to the output terminal of the third operational amplifier, a second input terminal of the sixth operational amplifier is coupled to a third reference voltage, and an output terminal of the sixth operational amplifier is connected to the first selector circuit;
wherein the first selector circuit is configured to select one of a signal outputted by the sixth operational amplifier and the signal outputted by the fourth operational amplifier so as to output the first selected signal.

8. The switching charger according to claim 7, wherein the plurality of operational amplifiers further include:
a seventh operational amplifier, wherein a first input terminal of the seventh operational amplifier is coupled to a fourth reference voltage, a second input terminal of the seventh operational amplifier is connected to the output terminal of the fourth operational amplifier, and an output terminal of the seventh operational amplifier is connected to the first selector circuit;
wherein the first selector circuit is configured to select one of a signal outputted by the sixth operational amplifier and a signal outputted by the seventh operational amplifier so as to output the first selected signal.

9. The switching charger according to claim 1, further comprising:
a sensing resistor, wherein a first terminal of the sensing resistor is connected to the first input terminal of the second operational amplifier, the second input terminal of the fourth operational amplifier and the second terminal of the inductor, and a second terminal of the sensing resistor is connected to the second input terminal of the second operational amplifier, the first input terminal of the fourth operational amplifier and the battery.

10. The switching charger according to claim 1, further comprising:
an input resistor, wherein a first terminal of the input resistor is connected to the input power source and the first input terminal of the third operational amplifier, and a second terminal of the input resistor is connected to the second input terminal of the third operational amplifier, the switch circuit and the system circuit.

11. The switching charger according to claim 10, further comprising:
a first switch component, wherein a first terminal of the first switch component is connected to the input power source;
a second switch component, wherein a first terminal of the second switch component is connected to a second terminal of the first switch component, and a second terminal of the second switch component is connected to the first terminal of the input resistor; and
a first switching circuit connected to a control terminal of the first switch component and a control terminal of the second switch component, and configured to switch the first switch component and the second switch component.

12. The switching charger according to claim 1, further comprising:
an error amplifier, wherein a first input terminal of the error amplifier is connected to an output terminal of the second selector circuit, a second input terminal of the error amplifier is coupled to the first reference voltage, and an output terminal of the error amplifier is connected to an input terminal of the control circuit.

13. The switching charger according to claim 12, further comprising:
an operational amplifier, wherein a first input terminal of the operational amplifier is connected to the output terminal of the error amplifier, a second input terminal of the operational amplifier is connected to an output terminal of an oscillator circuit, and an output terminal of the operational amplifier is connected to the input terminal of the control circuit.

14. The switching charger according to claim 12, further comprising:
a first resistor, wherein a first terminal of the first resistor is connected to the output terminal of the second selector circuit,
a first capacitor, wherein a first terminal of the first capacitor is connected to a second terminal of the first capacitor, and a second terminal of the first capacitor is connected to the first input terminal of the error amplifier; and
a second capacitor, wherein a first terminal of the second capacitor is connected to the first input terminal of the error amplifier, and a second terminal of the second capacitor is connected to the output terminal of the error amplifier.

15. The switching charger according to claim 14, further comprising:
a second resistor, wherein a first terminal of the second resistor is connected to the output terminal of the second selector circuit;

a third resistor, wherein a first terminal of the third resistor is connected to the first input terminal of the error amplifier; and a third capacitor, wherein a first terminal of the third capacitor is connected to a second terminal of the third resistor, and a second terminal of the third capacitor is connected to the output terminal of the error amplifier.

* * * * *